United States Patent
Chang et al.

(10) Patent No.: US 9,572,289 B2
(45) Date of Patent: Feb. 14, 2017

(54) DATA CENTER WITH COOLING SYSTEM

(71) Applicant: HON HAI PRECISION INDUSTRY CO., LTD., New Taipei (TW)

(72) Inventors: Chih-Hung Chang, New Taipei (TW); Shih-Chieh Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 71 days.

(21) Appl. No.: 14/256,381

(22) Filed: Apr. 18, 2014

(65) Prior Publication Data
US 2015/0305203 A1    Oct. 22, 2015

(51) Int. Cl.
*H05K 7/20* (2006.01)
*H05K 7/14* (2006.01)

(52) U.S. Cl.
CPC ........ *H05K 7/20745* (2013.01); *H05K 7/1497* (2013.01)

(58) Field of Classification Search
CPC ............... G06F 1/16; H05K 5/00; H05K 7/00; H05K 7/16
USPC . 361/679.46–679.54; 165/104.33; 29/890.03
See application file for complete search history.

(56) References Cited

U.S. PATENT DOCUMENTS

| | | | | |
|---|---|---|---|---|
| 7,430,118 B1* | 9/2008 | Noteboom | ......... | H05K 7/20745 165/104.33 |
| 7,672,128 B2* | 3/2010 | Noteboom | ......... | H05K 7/20745 165/104.22 |
| 8,054,625 B2* | 11/2011 | Noteboom | ......... | H05K 7/20736 165/104.33 |
| 8,251,785 B2* | 8/2012 | Schmitt | ................ | H05K 7/1497 361/695 |
| 8,462,496 B2* | 6/2013 | Schmitt | ..................... | G06F 1/20 165/104.33 |
| 8,913,381 B2* | 12/2014 | Noteboom | ......... | H05K 7/20745 165/104.22 |
| 8,943,757 B2* | 2/2015 | Parizeau | ................. | E04H 1/005 361/694 |
| 9,101,081 B2* | 8/2015 | Slaby | ................. | H05K 7/20745 |
| 9,258,930 B2* | 2/2016 | Gardner | ............... | H05K 7/1497 |
| 2011/0082592 A1* | 4/2011 | Saito | ..................... | F24F 5/0046 700/276 |
| 2011/0122561 A1* | 5/2011 | Pierson | .............. | H05K 7/20745 361/679.02 |
| 2012/0144850 A1* | 6/2012 | Hay | ......................... | G06F 1/20 62/91 |
| 2012/0258654 A1* | 10/2012 | Peng | .................. | H05K 7/20745 454/184 |
| 2012/0298334 A1* | 11/2012 | Madaffari | ......... | H05K 7/20745 165/104.13 |

(Continued)

*Primary Examiner* — Courtney Smith
*Assistant Examiner* — Matt Dhillon
(74) *Attorney, Agent, or Firm* — Zhigang Ma

(57) ABSTRACT

Data center includes a first container and a second container containing data racks therein. The first container includes an air intake for inputting outside cooling air into the first container. The second container contacts the first container via a base between the first container and the second container. The base defines a cooling air passage and heated air passage both communicating the first container and the second container. The cooling air passage inputs cooling air from the first container to the second container. The heated air passage inputs heated air from the second container to the first container.

18 Claims, 1 Drawing Sheet

(56) References Cited

U.S. PATENT DOCUMENTS

| | | | |
|---|---|---|---|
| 2013/0081784 A1* | 4/2013 | Faig Palomer | H05K 7/20745 165/80.2 |
| 2013/0340361 A1* | 12/2013 | Rogers | H05K 7/20745 52/173.1 |
| 2014/0038510 A1* | 2/2014 | Bailey | H05K 7/20745 454/339 |
| 2015/0011148 A1* | 1/2015 | Zwinkels | H05K 7/20745 454/184 |
| 2015/0034270 A1* | 2/2015 | Kim | H05K 7/20745 165/11.1 |

\* cited by examiner

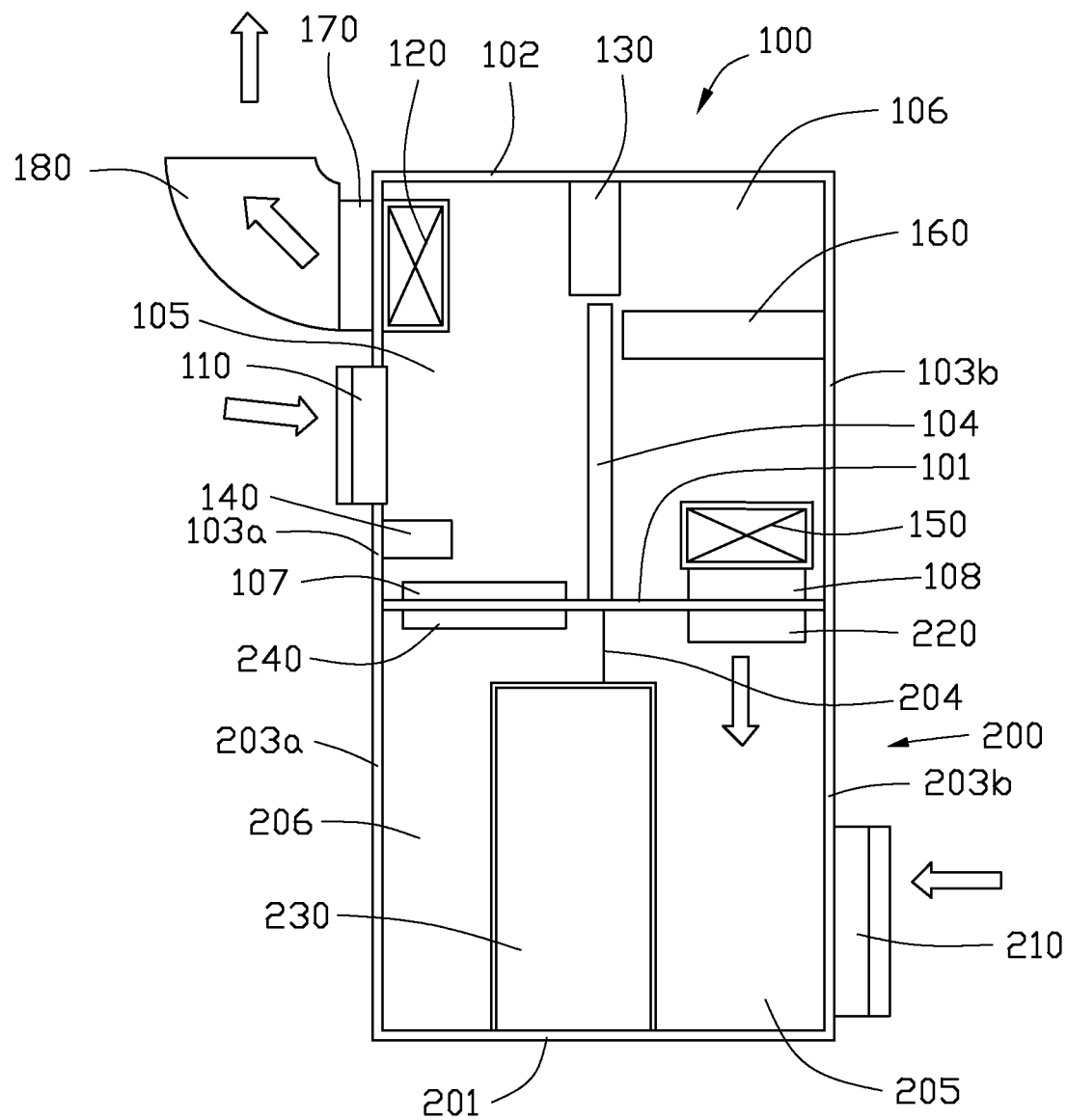

DATA CENTER WITH COOLING SYSTEM

FIELD

The present disclosure relates to data centers, and more particularly to a data center with cooling system.

BACKGROUND

The advent of cloud computing and virtualization and other new technologies make data center evolved into a very different environment. A data center includes data center equipment such as servers, storage and networking equipment. Temperature and moisture are two important environment factors which impact operating performance of the data center equipment.

When the data center equipment works, they generate a lot of heat. The heat must be removed rapidly, otherwise, the heat accommodated in the data center produces high temperature of the data center equipment, which results in unstable working performance of the data center equipment. Typically, the data center applies a cooling system to introduce outside air to directly cool the data center equipment.

BRIEF DESCRIPTION OF THE DRAWINGS

The FIGURE is a schematic side view of a data center with cooling system in accordance with an embodiment of the disclosure.

DETAILED DESCRIPTION

In the following disclosure the term "couple" is defined as connect, whether directly or indirectly through intervening components, and is not necessarily limited to physical connections. The connection can be such that the objects are permanently connected or releasably connected.

Referring to the FIGURE, a data center in accordance with an exemplary embodiment is shown. The data center can be a container data center which is one type of the data center. The container data center includes a first container 100 and a second container 200 under the first container 100. In this embodiment, the first container 100 is stacked on and contacts the second container 200 directly.

The first container 100 can be a standard container. An insulation layer (not labeled) with a suitable thickness can be positioned on an inner face of the first container 100. The first container 100 includes a ceiling 102, a first sidewall 103a and a second sidewall 103b opposite to the first sidewall 103a. A base 101 is located between the first container 100 and the second container 200 and coupling the first sidewall 103a and the second sidewall 103b. The base 101 is opposite and substantially parallel to the ceiling 102 which also couples the first sidewall 103a and the second sidewall 103b. The first sidewall 103a defines a first air intake. In this embodiment, a first air flow control device 110 is arranged at the first air intake for inputting and controlling outside air into the first container 100. A dust filter can cover an air inlet of the first flow control device 110.

In this embodiment, a first baffle plate 104 extending upwards from the base 101, a gap is left between the ceiling 102 and the first baffle plate 104. The first baffle plate 104 can be made of heat insulating material. A first air mixing member 130 is received in the gap and located between the ceiling 102 and the first baffle plate 104. The first air mixing member 130 can be vertically positioned. The first air mixing member 130 can include one or a plurality of porous plate(s). The porous plate can be a steel plate with a plurality of holes spacing from each other in certain interval. The porous plate also can be a steel wire gauze. The first baffle plate 104 and the first air mixing member 130 cooperatively divide the first container 100 into a first room 105 and a second room 106.

The first room 105 is located between the first baffle plate 104, the air mixing member 130 and the first sidewall 103a. The second room 106 is located between the first baffle plate 104, the first air mixing member 130 and the second sidewall 103b. A dew drain structure 140 is located under the first air intake in the first room 105. The base 101 forms an air input window 107 and an air exhaust 108 spaced from the air input window 107. The air input window 107 can locate in the first room 105. The air exhaust 108 can be located in the second room 106. The first room 105 communicates with the first air intake and the air input window 107. The second room 106 communicates with the air exhaust 108. A second air mixing member 160 is located in the second room 106. The second mixing member 160 can extend from the second sidewall 103b towards the first baffle plate 104. The second air mixing member 160 can be horizontally positioned. The second air mixing member 160 can include one or more porous plate(s). The porous plate can be a steel plate with a plurality of holes spaced from each other in a predetermined interval. The porous plate also can be a steel wire gauze. In this embodiment, an air driving device 150 can be arranged at the air exhaust 108 in the second room 106, the air driving device 150 can include one or a plurality of fan(s)/blower(s).

The first sidewall 103a of the first container 100 further defines an air outlet above the first air intake. An exhaust air driving device 120 can be positioned at the air outlet. The exhaust air driving device 120 can be located in the first room 105. The exhaust air driving device 160 can include one or a plurality of fan(s)/blower(s). A second air flow control device 170 can be arranged at an air outlet of the exhaust air driving device 120 for outputting and controlling volume of air from the first room 105 to ambient air. The second air flow control device 170 can further be attached with an exhaust air duct 180 at an air exhaust thereof. The exhaust air duct 180 has an air outlet thereof facing upwards, for keeping the air from the first room 105 be dissipated upwards.

The second container 200 can be a standard container, and contains a plurality of data racks 230 therein. An insulation layer (not shown) with a suitable thickness can be positioned on an inner face of the second container 200. The second container 200 includes a bottom 201 opposite to the base 101, a first sidewall 203a and a second sidewall 203b opposite to the first sidewall 203a. The first sidewall 203a and the second sidewall 203b both couple the bottom 201 and the base 101. The second container 200 can further include another base contacting or overlapping the base 101. The first sidewall 203a can be in alignment with the first sidewall 103a of the first container 100. The second sidewall 203b can be in alignment with the second sidewall 103b of the first container 100. The second sidewall 203b can define a second air intake in lower portion thereof. In this embodiment, a third air flow control device 210 is arranged at the second air intake for inputting and controlling outside air into the second container 200. The third air flow control device 210 can be an electric air flow control device. A dust filter can cover an air intake of the third flow control device 210.

In the second container 200, the base 101 forms an air inlet 220 communicating with the air exhaust 108 of the first container 100, and an air output window 240 communicating with the air input window 107 of the first container 100. In this embodiment, the air inlet 220 can be just corresponding to and directly communicating with the air exhaust 108, the air output window 240 can be just corresponding to and directly communicating with the air input window 107. The air exhaust 108 and the air inlet 220 cooperatively define a cooling air passage extending through/in the base 101. The air output window 240 and the air input window 107 cooperatively define a heated air passage extending through/in the base 101.

In the second container 200, a gap can be left between the base 101 and a top of the data racks 230, a second baffle plate 204 is received in the gap. The second baffle plate 204 depends from the base 101 towards the top of the data racks 230. The second baffle plate 204 can be made of heat insulating material. The second baffle plate 204 and the data racks 230 substantially divide the second container 200 into a cooling air channel 205 and a heated air channel 206. The cooling air channel 205 is located between the second baffle plate 204, the data racks 230 and the second sidewall 203b, and faces air inlets of data equipment such as network exchangers, servers and computers located at the data racks 230. The cooling air channel 205 communicates with the second air intake of the second sidewall 203b and the air inlet 220. The heated air channel 206 is located between the second baffle plate 104, the data racks 230 and the first sidewall 203a. The heated air channel 206 communicates with the air output window 240 of the base 101.

When the container data center is in operation, the first air flow control device 110 on the first sidewall 103a of the first container 100 inputs and controls outside cooling air into the first room 105 of first container 100. The first container 100 can provide heated air from the second container 200 into the first room 105 via the air input window 107 in the base 101. The outside cooling air and the heated air meet in the first room 105, which may produce condensation in the first room 105, and the condensation are drained outwards by the drain structure 140. One part of the heated air in the first room 105 is exhausted into ambient air via the exhaust air driving device 120, the second air flow control device 170 and the exhaust air duct 180. One part of the heated air in the first room 105 and the outside cooling air are mixed to be mixed cooling air by the first air mixing member 130 and are drawn into the second room 106 from the first room 105 of the first container 100. The mixed cooling air is further mixed by the second air mixing member 160 to be cooling air. The cooling air is drawn by the air driving device 150 into the air exhaust 108 of the first container 100 and enters the cooling air channel 205 via the air inlet 220 in the base 101. The third air flow control device 210 at the lower portion of the second sidewall 203b inputs and controls outside cooling air into the cooling air channel 205 of the second container 200. The cooling air from the first container 100 and the outside cooling air in the cooling air channel 205 blow to the data equipment at the data racks 230. The cooling air from the first container 100 and the outside cooling air input by the third air flow control device 210 can be mixed before they blow to the data equipment at the data racks 230. When the cooling air passes the data equipment at the data racks 230, it removes heat generated by the data equipment and is heated to be the heated air in the heated air channel 206. The heated air in the heated air channel 206 enters into the first room 105 of the first container 100 via the air output window 240 of the second container 200 and the air input window 107 of the first container 100. In this embodiment, the outside cooling air, the cooling air and heated air enter into or exit out of the first container 100 and the container 200 substantially along directions as arrows shown in the FIGURE.

According to this embodiment, in the first container 100, the outside cooling air and the heated air from the second container 200 is mixed, by this manner, the moisture in the outside cooling air is reduced, which avoids oxidative damage or other adverse impact to the data equipment and the data racks 230. Additionally, the second container 200 further inputs outside cooling air in the cooling air channel 205 to cool the data equipment at the data racks 230, by this manner, a power usage effectiveness of the container data center is reduced.

Additionally, the outside cooling air can be natural air. When the outside cooling air is natural air, the data center introduces the natural air to reduce moisture of the natural air to directly cool the data equipment at the data racks 230, so the data center can be called as data center with free cooling system, and cooling cost for the data center is lowered, comparing with that for a traditional data center.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A data center, comprising:
a first container, a second container and a base located between the first container and the second container; the first container comprising a ceiling, a first sidewall, a second sidewall opposite to the first sidewall, a baffle plate extending upwards from the base, a first room for inputting outside cooling air from ambient and heated air from the second container, a second room separating from the first room for providing cooling air to the second container, a baffle plate, a first air mixing member for mixing the outside cooling air and the heated air to be cooling air, and a second air mixing member configured to further cool the cooling air; the second container containing data racks for supporting data equipment, the second container comprising a cooling air channel and a heated air channel at two opposite sides of the data racks, the cooling air channel communicating with the second room of the first container via the base for inputting the cooling air from the second room, the heated air channel communicating with the first room via the base for outputting the heated air to the first room,
wherein the first air mixing member is coupled to a ceiling of the first container, the baffle plate is substantially perpendicularly coupled to the base, and the first air mixing member and the baffle plate aligned in a straight line that is substantially perpendicular to the base, to divide the first container into the first room and the second room; a gap is defined between the ceiling and a top of the baffle plate, and the first mixing member is vertically positioned in the gap; the first room is defined cooperatively by the ceiling, the first sidewall, the base, the first air mixing member, and the baffle plate, and the second room is defined cooperatively by the ceiling, the second sidewall, the base, the first air mixing member, and the baffle plate; and the second air mixing member is horizontally located in the second room.

2. The data center of claim 1, wherein the base forms an air input window in the first room, an air exhaust in the second room, an air inlet in the cooling air channel and an air output window in the heated air channel, the air exhaust communicating with the air inlet in the base, the air input window communicating with the air output window in the base.

3. The data center of claim 2, wherein the first sidewall of the first container defines an air intake for inputting the outside cooling air from the ambient into the first room and an air outlet for outputting part of the heated air from the first room.

4. The data center of claim 3, wherein the second container comprises two opposite sidewalls coupled by the base, the first sidewall and second sidewall of the first container corresponding to the two opposite sidewalls of the second container, respectively.

5. The data center of claim 4, wherein one of the two sidewalls of the second container defines an air intake for inputting the outside cooling air from the ambient into the cooling air channel.

6. The data center of claim 1, wherein the first container further comprises a drain structure in the first room.

7. The data center of claim 1, wherein the first air mixing member from the ceiling, and the second air mixing member extends from the second sidewall towards the baffle plate and is below the gap.

8. The data center of claim 2, wherein the first container further comprises an air driving device located in the second room, and the air driving device is aligned with the air exhaust.

9. A data center, comprising:
a first container comprising an air intake inputting outside cooling air into the first container, and the first container further comprising a first air mixing member and a baffle plate, the first air mixing member configured to mix heated air and the outside cooling air in the first container to become the cooling air; the first air mixing device coupled to a ceiling of the first container, the baffle plate substantially perpendicularly coupled to a base of the first container, and the first air mixing member and the baffle plate aligned in a straight line that is substantially perpendicular to the base, to divide the first container into a first room communicating with the air intake and a second room;
a second container containing data racks therein, the second container contacting the first container via the base between the first container and the second container, the base defining a cooling air passage and a heated air passage both communicating with the first container and the second container, the cooling air passage inputting cooling air from the first container to the second container, the heated air passage inputting heated air from the second container to the first container;

wherein the first container further comprises a ceiling, a first sidewall, a second sidewall opposite to the first sidewall, and a second air mixing member configured to further cool the cooling air; a gap is defined between the ceiling and a top of the battle plate, and the first mixing member is vertically positioned in the gap; the first room is defined cooperatively by the ceiling, the first sidewall, the base, the first air mixing member, and the baffle plate, and the second room is defined cooperatively by the ceiling, the second sidewall, the base, the first air mixing member, and the baffle plate; and the second air mixing member is horizontally located in the second room.

10. The data center of claim 9, wherein the first air mixing member extends from the ceiling, and the second air mixing member extends from the second sidewall towards the baffle plate and is below the gap.

11. The data center of claim 9, wherein the first container further comprises an air driving device located in the second room, and the air driving device is aligned with the air exhaust.

12. The data center of claim 9, wherein the first container is stacked on the second container.

13. The data center of claim 9, wherein the base forms an air input window and an air exhaust both in the first container, the air input window being spaced from the air exhaust, the base further forming an air inlet and an air output window in the second container, the air inlet being spaced from the air output window, the air exhaust and the air inlet cooperatively defining the cooling air passage, the air output window and the air input window cooperatively defining the heated air passage.

14. The data center of claim 9, wherein the second container comprises another baffle plate, the another baffle plate and data racks cooperatively dividing the second container into a cooling air channel communicating with the second room of the first container via the cooling air passage, and a heated air channel communicating with the first room of the first container via the heated air passage.

15. The data center of claim 14, wherein the first sidewall defines an air outlet communicating with the first room.

16. The data center of claim 15, wherein the air intake of the first container is located between the air outlet and the base.

17. The data center of claim 9, wherein the first container has an air flow control device located at the air intake for inputting and controlling the outside cooling air into the first room of the first container.

18. The data center of claim 9, wherein the second container defines another air intake for inputting outside cooling air together with the cooling air to cool data equipment supported by the data racks in the second container.

* * * * *